United States Patent
Narayanan et al.

(10) Patent No.: US 6,943,126 B1
(45) Date of Patent: Sep. 13, 2005

(54) DEUTERIUM INCORPORATED NITRIDE

(75) Inventors: Sundar Narayanan, Santa Clara, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 110 days.

(21) Appl. No.: 10/314,381

(22) Filed: Dec. 6, 2002

(51) Int. Cl.$^7$ .................. H01L 21/31; H01L 21/469
(52) U.S. Cl. ............... 438/784; 438/778; 438/783; 438/791
(58) Field of Search ............... 438/308, 475, 438/528, 530, 795, 762, 763, 766, 769, 778, 438/783, 784, 791

(56) References Cited

U.S. PATENT DOCUMENTS

| | | | |
|---|---|---|---|
| 5,909,627 A * | 6/1999 | Egloff | 438/406 |
| 5,972,765 A | 10/1999 | Clark et al. | |
| 6,156,653 A * | 12/2000 | Smythe et al. | 438/680 |
| 6,218,245 B1 | 4/2001 | Xiang et al. | |
| 6,255,197 B1 * | 7/2001 | Fujimura et al. | 438/475 |
| 6,436,799 B1 | 8/2002 | Ramkumar et al. | |
| 6,444,533 B1 * | 9/2002 | Lyding et al. | 438/308 |
| 6,544,908 B1 * | 4/2003 | Weimer et al. | 438/798 |
| 6,576,522 B2 * | 6/2003 | Chetlur et al. | 438/359 |
| 6,677,213 B1 * | 1/2004 | Ramkumar et al. | 438/308 |
| 2003/0012538 A1 * | 1/2003 | Johnson et al. | 385/129 |
| 2003/0020111 A1 | 1/2003 | Bevan | |
| 2003/0219950 A1 * | 11/2003 | Lyding et al. | 438/301 |
| 2004/0096582 A1 * | 5/2004 | Wang et al. | 427/255.27 |
| 2004/0251521 A1 * | 12/2004 | Tanaka et al. | 257/639 |

FOREIGN PATENT DOCUMENTS

| | | | | |
|---|---|---|---|---|
| JP | 2000012550 A * | 1/2000 | ......... | H01L 21/324 |

OTHER PUBLICATIONS

Encyclopedia of Chemical Technology, Kirk-Othmer, vol. 14, pp. 677-709 (1995).
Van Zant, Peter, 2000, "Microchip Fabrication: A Practical Guide to Semiconductor Processing", 3$^{th}$ ed., pp. 491-527.
Baumvol, I., E. Gusev, F. Stedile, F. Freire, Jr., M. Green, and D. Brasen, "On the behavior of deuterium in ultrathin $SiO_2$ films upon thermal annealing," *Appl. Phys. Lett.*, 72(4)450-452 (1998).
Clark, W., T. Ference, S. Mittl, J. Burnham, and E. Adams, "Improved Hot-Electron Reliability in High-Performance, Multilevel-Metal CMOS Using Deuterated Barrier-Nitride Processing," *IEEE Electron Device Lett.*, 20(10):501-503 (1999).
Clark, W., T. Ference, T. Hook, K. Watson, et al., "Process Stability of Deuterium-Annealed MOSFET's," *IEEE Electron Device Lett.*, 20(1):48-51 (1999).
Ference, T., J. Burnham, W. Clark, T. Hook, et al., "The Combined Effects of Deuterium Anneals and Deuterated Barrier-Nitride Processing on Hot-Electron Degradation in MOSFET's," *IEEE Trans. Elec. Dev.*, 46(4)747-753 (1999).
Hess, K., I. Kizilyalli, and J. Lyding, "Giant Isotope Effect in Hot Electron Degradation of Metal Oxide Silicon Devices," *IEEE Trans. Elec. Dev.*, 45(2)406-416 (1998).

(Continued)

*Primary Examiner*—George Eckert
(74) *Attorney, Agent, or Firm*—Evan Law Group LLC

(57) ABSTRACT

A method of forming a semiconductor structure comprises forming an etch-stop layer comprising nitride, on a stack. The stack is on a semiconductor substrate, and the stack comprises (i) a gate layer. The forming is by CVD with a gas comprising a first compound which is $Si_xL_{2x}$, and a second compound comprising nitrogen and deuterium, L is an amino group, and X is 1 or 2.

15 Claims, 5 Drawing Sheets

OTHER PUBLICATIONS

Kizilyalli, I., G. Abeln, Z. Chen, J. Lee, G. Weber, et al., "Improvement of Hot Carrier Reliability with Deuterium Anneals for Manufacturing Multilevel Metal/Dielectric MOS Systems," *IEEE Elec. Dev. Lett.*, 19(11):444-446 (1998).

Lee, J., K. Cheng, Z. Chen, K. Hess, et al., "Application of High Pressure Deuterium Annealing for Improving the Hot Carrier Reliability of CMOS Transistors," *IEEE Elec. Dev. Lett.*, 21(5):221-223 (2000).

Lee, J., S. Aur, R. Ecklund, K. Hess, and J. Lyding, "Secondary ion mass spectroscopy characterization of the deuterium sintering process for enhanced-lifetime complementary metal-oxide-semiconductor transistors," *J. Vac. Sci. Technol.*, 16(3)1762-1766 (1998).

Lee, J., Y. Epstein, A. Berti, J. Huber, et al., "The Effect of Deuterium Passivation at Different Steps of CMOS Processing on Lifetume Improvements of CMOS Transistors," *IEEE Trans. Elec. Dev.*, 46(8)1812-1813 (1999).

* cited by examiner

DEUTERIUM INCORPORATED NITRIDE

BACKGROUND

The present invention relates to semiconductor structures, semiconductor devices and methods of making the same.

Dangling bonds at the silicon/silicon oxide interface in semiconductor devices are believed to be the cause of observed non-ideal capacitance-voltage characteristics and reduced channel conductance. Low temperature post-metallization annealing in a hydrogen-containing atmosphere is typically used in the semiconductor device fabrication process, to passivate these dangling bonds. During operation, however, transistor performance can degrade, and this degradation has been correlated to the removal of hydrogen from the silicon/silicon oxide interface, due to collisions between heated carriers and the interface. This degradation in hot carrier lifetime (also referred to as HCl lifetime) is exacerbated by the ever ongoing miniaturization of semiconductor devices, and has become a significant limitation in the further shrinkage of semiconductor devices.

A widely used method for minimizing the degradation of HCl lifetime has been to reduce the peak of the electric field in the transistor by appropriate selection of spacer dimensions, and the implantation of ions to form lightly doped regions between the channel and the corresponding source/drain regions of the transistor. Continued miniaturization is severely limiting the usefulness of these techniques.

Another method is to replace hydrogen with deuterium during annealing, taking advantage of the increased strength of the deuterium-silicon bond as compared with the hydrogen-silicon bond. It has been discovered, however, that deuterium is unable to penetrate through silicon nitride layers, present in many semiconductor devices as etch-stop layers and gate spacers. If the deuterium annealing is carried out prior to the formation of the silicon nitride layers, the high-temperatures necessary to form the silicon nitride layers, as well as the boron-phosphorous spin glass layers conventionally used as interlayer dielectrics (formed at 750° C. or more), may cause the deuterium to diffuse out. Attempts to overcome these problems have relied on expensive techniques, such as using deuterated silane and ammonia to form the silicon nitride layers, or dangerous techniques, such as annealing in a 100% deuterium atmosphere.

U.S. Pat. No. 6,436,799 describes incorporating deuterium by annealing in a deuterium-containing atmosphere. A small exposed portion of the substrate near the interface is present after etching contact holes in the etch-stop layer, which takes place after formation of the etch-stop layer and the interlayer dielectric. At this point there will be no further exposure of the substrate/gate dielectric interface to temperatures above 750° C., so the incorporated deuterium will not be lost.

BRIEF SUMMARY

In a first aspect, the present invention is a method of forming a semiconductor structure, comprising forming an etch-stop layer comprising nitride, on a stack. The stack is on a semiconductor substrate, and the stack comprises (i) a gate layer. The forming is by CVD with a gas comprising a first compound which is $Si_xL_{2x}$, and a second compound comprising nitrogen and deuterium, L is an amino group, and X is 1 or 2.

In a second aspect, the present invention is a method of forming a semiconductor structure, comprising forming an etch-stop layer comprising nitride on a stack at a temperature of at most 700° C., and simultaneously incorporating deuterium into a semiconductor substrate. The stack is on the semiconductor substrate, and the stack comprises (i) a gate layer.

In a third aspect, the present invention is a semiconductor structure, comprising a semiconductor substrate, a stack comprising (i) a gate layer on the semiconductor substrate, an etch-stop layer comprising nitride on the stack, a dielectric layer comprising phosphosilicate glass on the etch-stop layer, and a via contact through the dielectric layer to the semiconductor substrate. The semiconductor substrate is deuterium enriched.

The phrase "secondary amino group" means a moiety that contains a nitrogen having two substituents, the moiety being attached through the nitrogen.

The phrase "deuterium enriched" means that the amount of deuterium, as a percent of the hydrogen present, is greater than the amount that would be expected based on the natural isotopic abundance of deuterium in hydrogen. Preferably, at least 90% of the hydrogen is deuterium, more preferably at least 99%.

DETAILED DESCRIPTION

The present invention includes forming an etch-stop layer containing nitride formed at lower temperatures using deuterated ammonia, $ND_3$, or related compounds. The lower temperature of formation of the etch-stop layer allows for a higher concentration of deuterium to be incorporated into the substrate. Furthermore, the interlayer dielectric layer is also formed at lower temperatures, preventing loss of the deuterium incorporated during formation of the etch-stop layer.

Figure 1:
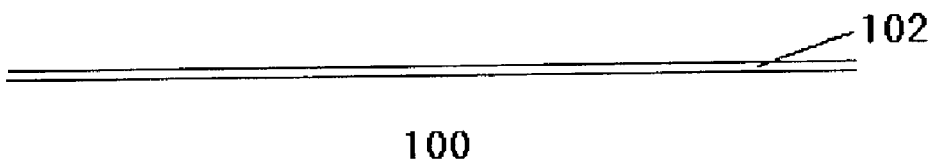
FIGS. 1–7 illustrate a method of forming the structure of FIG. 8.

Referring to FIG. 1, a gate insulating layer 102 is on a semiconductor substrate 100. The semiconductor substrate may be a conventionally known semiconductor material. Examples of semiconductor materials include silicon, gallium arsenide, germanium, gallium nitride, aluminum phosphide, and alloys such as $Si_{1-x}Ge_x$ and $Al_xGa_{1-x}As$, where $0 \leq x \leq 1$. Preferably, the semiconductor substrate is silicon, which may be doped or undoped. The gate insulating layer 102 may be a conventionally known insulating material. For example, the gate insulating layer may contain silicon oxide or silicon oxynitride.

Figure 2:
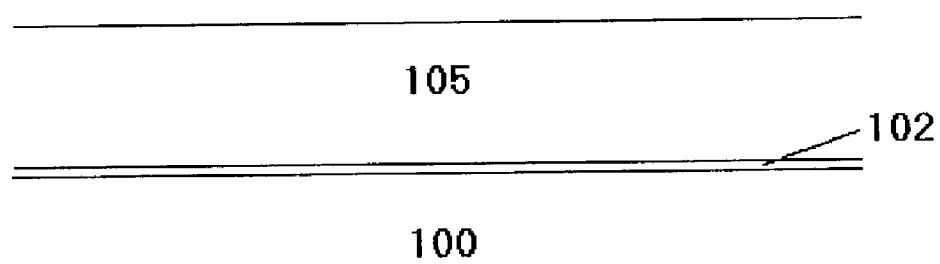

Referring to FIG. 2, a gate layer 105 may be formed on the gate insulating layer. The gate layer may contain a variety of semiconducting materials. Alternatively, the gate layer may be a metallic layer, similar to metallic layer 125 of FIG. 3. Typically, a gate layer contains polycrystalline silicon (poly) or amorphous silicon. The gate layer may be doped with one type of dopant ($P^+$ or $N^+$), or it may contain both types of dopants in discrete regions. A split gate is a gate layer containing both $P^+$ and $N^+$ doping regions.

In the case of a split gate, those regions of the gate that are $P^+$ doped (such as with B or $BF_2^+$) are over $N^-$ doped channel regions of the substrate, forming a PMOS device; those regions of the gate that are $N^+$ doped (such as with $As^+$ or phosphorus$^+$) are over $P^-$ doped channel regions of the substrate, forming an NMOS device. The $P^+$ and $N^+$ doping regions of the gate are separated by a region which is on an isolation region of the substrate; this isolation region has a width of at most 0.4 microns, more preferably at most 0.36 microns. The doping of the regions of the gate is preferably carried out after forming the gate, by masking and doping each region separately, or by an overall doping of the gate with one dopant type, and then masking and doping only one region with the other dopant type (counter doping).

Figure 3:
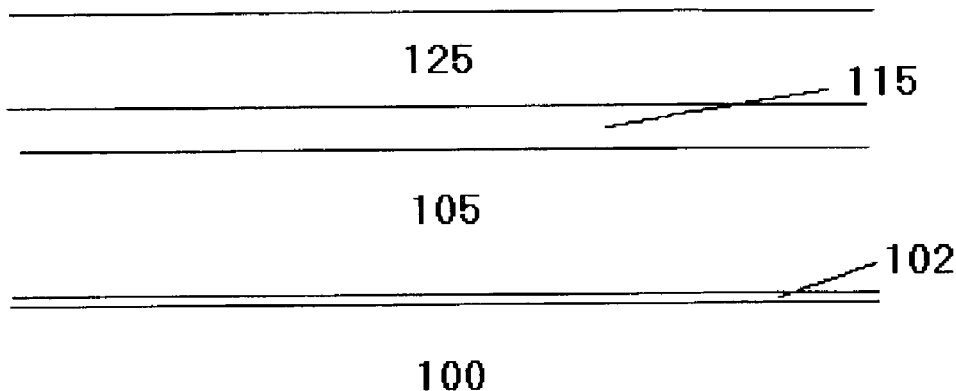

Referring to FIG. 3, a barrier layer 115 may optionally be formed on the gate layer. The optional barrier layer may contain a variety of materials, including nitrides, silicides, and oxides, and is preferably a conductive material. For example, the barrier layer may contain refractory silicides and nitrides. Preferably, the barrier layer contains silicon nitride, or a nitride or silicide of a metal such as tantalum, titanium, niobium or tungsten, for example tungsten nitride.

Referring still to FIG. 3, a metallic layer 125 may optionally be formed on the gate layer, or the barrier layer 115, if it is present. Preferably, the metallic layer has a thickness of 200–600 angstroms, more preferably 300–500 angstroms, most preferably 325–450 angstroms. The metallic layer 125 may contain a variety of metal-containing materials. For example, a metallic layer may contain aluminum, copper, tantalum, titanium, tungsten, or alloys or compounds thereof. Preferably, the metallic layer comprises tungsten or titanium. The metallic layer may be formed, for example, by physical vapor deposition (PVD) of the metal, or by low pressure chemical vapor deposition (LPCVD) of a mixture of a metal halide and hydrogen.

Figure 4:
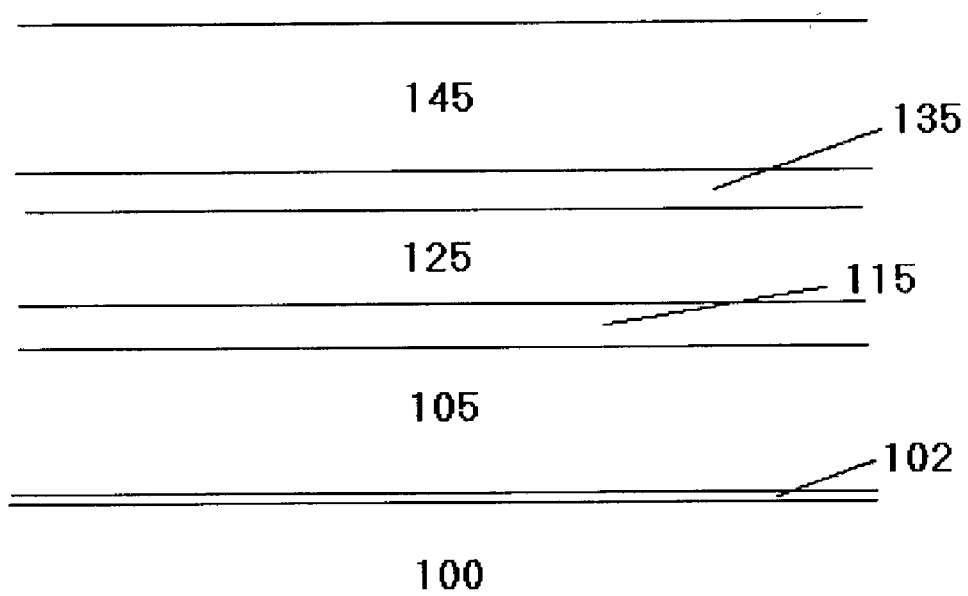

Referring to FIG. 4, a barrier layer 135 may optionally be formed on the metallic layer. The formation of the second optional barrier layer may be performed as described for the first optional barrier layer 115, and this layer may be formed of the same materials, and to the same thicknesses.

Referring still to FIG. 4, an etch-stop layer 145 may be formed on the metallic layer by a variety of methods, including chemical vapor deposition (CVD). Preferably, the etch-stop layer is a nitride layer. The etch-stop layer may vary in composition, so that the top of the etch-stop layer is anti-reflective, for example so that the top of the etch-stop layer is silicon rich silicon nitride, or silicon oxynitride; this layer may also act as a hard mask to protect the etch-stop layer during subsequent etches. Alternatively, a separate anti-reflective layer (ARC) may be formed.

Preferably, the etch-stop layer is formed by chemical vapor deposition (CVD) with a gas containing a silane, more preferably with a silane of the formula $Si_xL_{2x}$, where x is 1 or 2, and L is an amino group, to form a nitride layer, more preferably BTBAS (bis-(t-butylamino)silane). Preferably, L is an alkyl amino group. The different L groups may be the same or different. Preferably, the reaction is with a nitrogen-hydrogen containing compound, more preferably with ammonia. At least a portion of the hydrogen in the nitrogen-hydrogen containing compound is replaced with deuterium, preferably at least 90% of the hydrogen is replaced with deuterium, most preferably at least 99% of the hydrogen is replaced with deuterium. The use of the symbol "D" in a chemical formula means that at least the majority of the hydrogen represented by that symbol in the compound is the deuterium isotope.

The ratio between the silane:nitrogen-hydrogen containing compound is preferably 1:0.5 to 1:5, more preferably 1:1 to 1:3, most preferably 1:2. The pressure during nitride formation is preferably 100–300 mTorr, more preferably 150 mTorr.

Forming the etch-stop layer using a nitrogen-hydrogen compound containing deuterium reslults in the incorporation of deuterium into the substrate. This results in an increase in the HCl lifetime, as compared with an otherwise identical structure having a nitride layer formed under identical conditions using $NH_3$ instead of $ND_3$ (or in the case of a different nitrogen-hydrogen containing compound, using the hydrogen containing compound instead of the deuterium containing compound). The increase in HCl lifetime of at least 10%, more preferably at least 50%, most preferably at least 200%, such as 300–600%, may be obtained as a result of the present method.

The HCl lifetime is measured as follows:

(1) Characterize the substrate current for the transistors by measuring $I_{bb}$ while sweeping the gate voltage from 0 to $V_{cc(nom)}$ and stepping the drain voltage over four values starting at $V_{cc(nom)}$ and with a step value of 10% $V_{cc(nom)}$. For each value of $V_{ds}$ measured, record the value of gate voltage that yields the maximum substrate current and record the substrate current at that setting.

(2) Stress the transistors at 3 different values of $V_{ds}$. The values of $V_{ds}$ should be chosen so as to cause a significant shift in $I_{dlin}$ (>30%) in a measurement time of less than 24 hours. The voltage should not be set so high as to result in distorted I-V characteristics. The gate voltage should be set at the value yielding maximum $I_{bb}$ for a given $V_{ds}$. Stress until $I_{dlin}$ shifts by 30%, unless this occurs in less than 1000 sec., in which case the stopping criteria is a 40% shift in $I_{dlin}$, or a lower voltage should be used.

(3) The data is extrapolated to determine HCl lifetime ($T_{lin}$), the time for $I_{dlin}$ to shift by 40%.

The nitride layer is preferably formed at a temperature of at most 750° C., more preferably at a temperature below 750° C., even more preferably at a temperature of at most 700° C. The temperature is preferably 500–750° C., more preferably, 550–700° C., most preferably 550–650° C. The depositing of the etch-stop layer is preferably carried out at a temperature and for a time that does not result in substantial diffusion between the $P^+$ region and the $N^+$ region in a split gate. "Substantial diffusion between the $P^+$ region and the $N^+$ region" of the gate means that the threshold voltage ($V_T$) one or both of the PMOS device or NMOS device changes by more than 20 mV, more preferably 10 mV, even more preferably 5 mV. In order to determine if an etch-stop layer formation results in substantial diffusion between the $P^+$ region and the $N^+$ region of a particular split gate, a single PMOS device or NMOS device is formed, with the other part of the gate forming a comparatively very large reservoir of the opposite doping type, separated by an isolation region of the same size as the actual device. The PMOS device or NMOS device is formed using the selective oxidation and the spacer formation used in the example, and etch-stop layer formation of interest.

Preferably, the etch-stop layer has a thickness of at least 800 angstroms, more preferably a thickness of at least 1100 angstroms, most preferably a thickness of at least 1200, after etching of the gate layer, and after formation of gate spacers. About 500 angstroms of etch-stop may be lost during the gate layer etch, and about 200 angstroms of etch-stop may be lost during the spacer formation. Preferably, at least 1500 angstroms thickness of etch-stop are deposited, more preferably at least 1800 angstroms thickness of etch-stop are deposited, most preferably 2100 angstroms thickness of etch-stop are deposited. Preferably, after the gate layer etch and after spacer formation (or, alternatively, after the dielectric layer is formed), the etch-stop layer has a thickness of 800–1800 angstroms, more preferably a thickness of 1100–1500 angstroms, most preferably a thickness of 1200–1400 angstroms. Similarly, the thickness deposited would preferably be these same ranges, with an additional 700 angstroms added to accommodate loss during the gate layer etch and spacer formation, when material are used which may result in a loss of the etch-stop layer at these points in the process.

Figure 5:
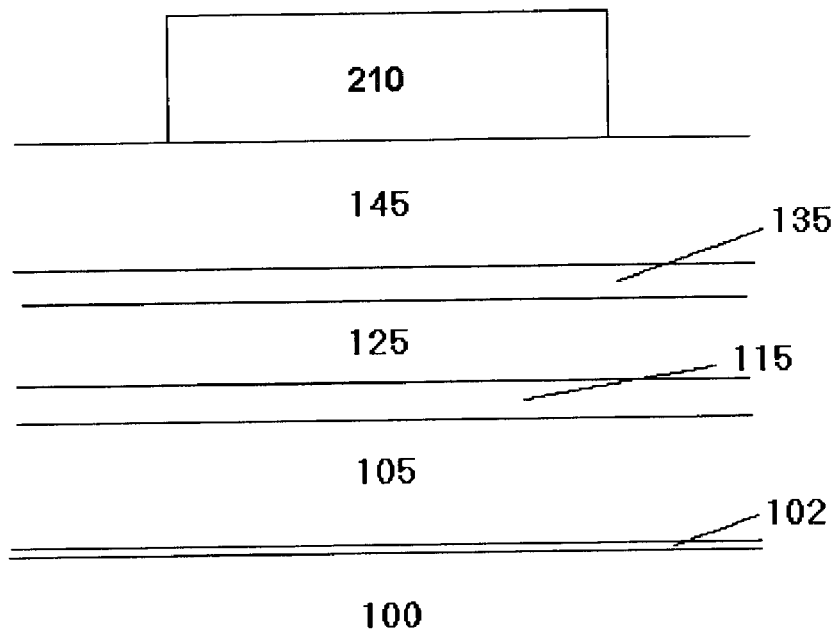
Figure 6:
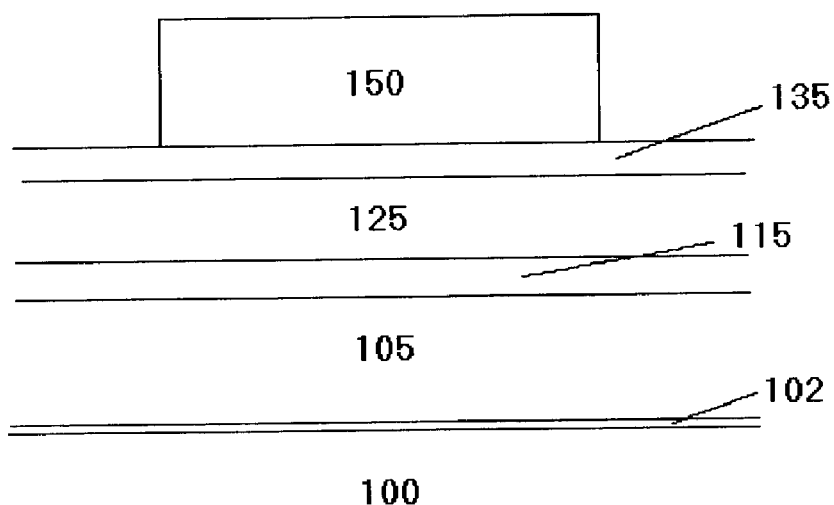

Referring to FIGS. 5–8, each layer may be patterned to form the gate stack. The patterning may be accomplished, for example, by conventional photolithographic and etching techniques. Referring to FIGS. 5 and 6, the etch-stop layer may be etched to form a patterned etch-stop layer 150, for example by forming a patterned photoresist 210 on etch-stop layer 145 (FIG. 5) and then etching the exposed portions of the layer. A hydrofluoric acid dip may be used to remove sidewall passivation.

The etch-stop etching may be carried out by exposure to a plasma formed from a mixture of gasses. Preferably, the gasses include $CF_4$ and $CHF_3$.

Figure 7:
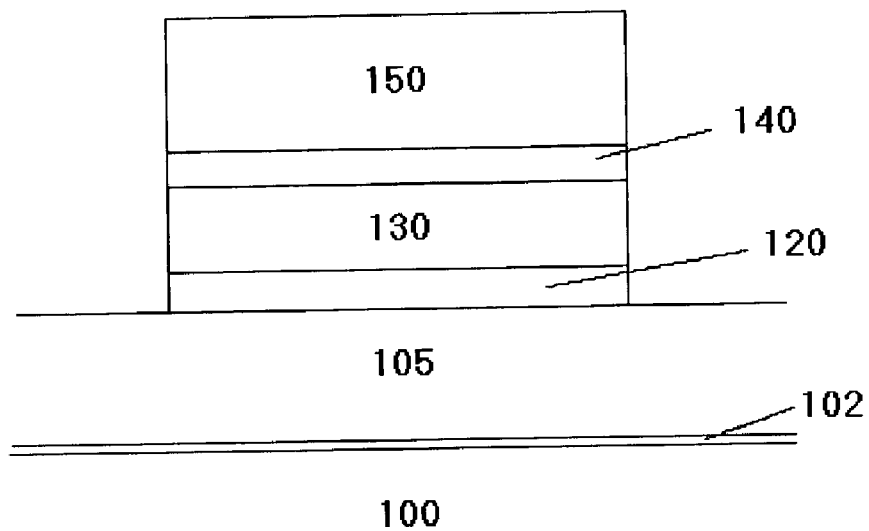
Figure 8:
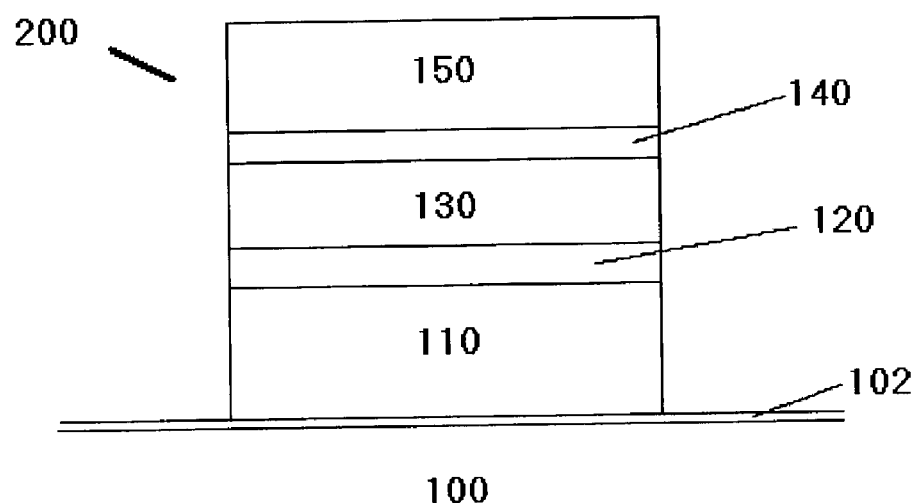
FIG. 8 shows a gate stack of the present invention.

Referring to FIG. 7, the patterned etch-stop layer may be used as a hard mask for the etching of the metallic layer 125 (FIG. 6) to form a patterned metallic layer 130. Referring to FIG. 8, the patterned etch-stop layer and the patterned metallic layer may be used as a hard mask for the etching of the gate layer 105 (FIG. 7) to form patterned gate layer 110. The gate etching may be carried out by conventional gate etch techniques, for example by exposure to a plasma formed from chlorine, hydrobromic acid and/or oxygen.

The patterned photoresist 210 (FIG. 5) may be removed at any stage of the gate stack formation following the etch-stop etch. For example, the patterned photoresist may be removed immediately after the etch-stop etch (as illustrated in FIGS. 5 and 6), or it may be removed after the etching of the metallic layer or after the gate etching. The removal of the photoresist may be followed by a cleaning procedure to ensure removal of any residual byproduct of the photoresist or of the photoresist removal. For example, the photoresist may be removed by ashing the patterned photoresist to provide a gate stack containing a patterned etch-stop layer (FIG. 6). This gate stack without a photoresist layer may then be treated with a cleaning solution to complete the removal and cleaning process. The most preferred cleaning agent contains water, 2-(2 aminoethoxy) ethanol, hydroxylamine, and catechol. An example of a cleaning solution is EKC265™ (EKC, Hayward, Calif.).

FIG. 8 thus illustrates a gate stack 200 which may be formed on a semiconductor wafer. Semiconductor substrate 100 supports a gate insulating layer 102, which in turn supports a gate layer 110. The gate layer supports an optional metallic layer 130, which may optionally be separated from the gate layer by barrier layer 120. The optional metallic layer may support an optional barrier layer 140. The etch-stop layer 150 is on the gate layer, on the optional metallic layer 130, or is on the optional barrier layer 140.

Figure 9:
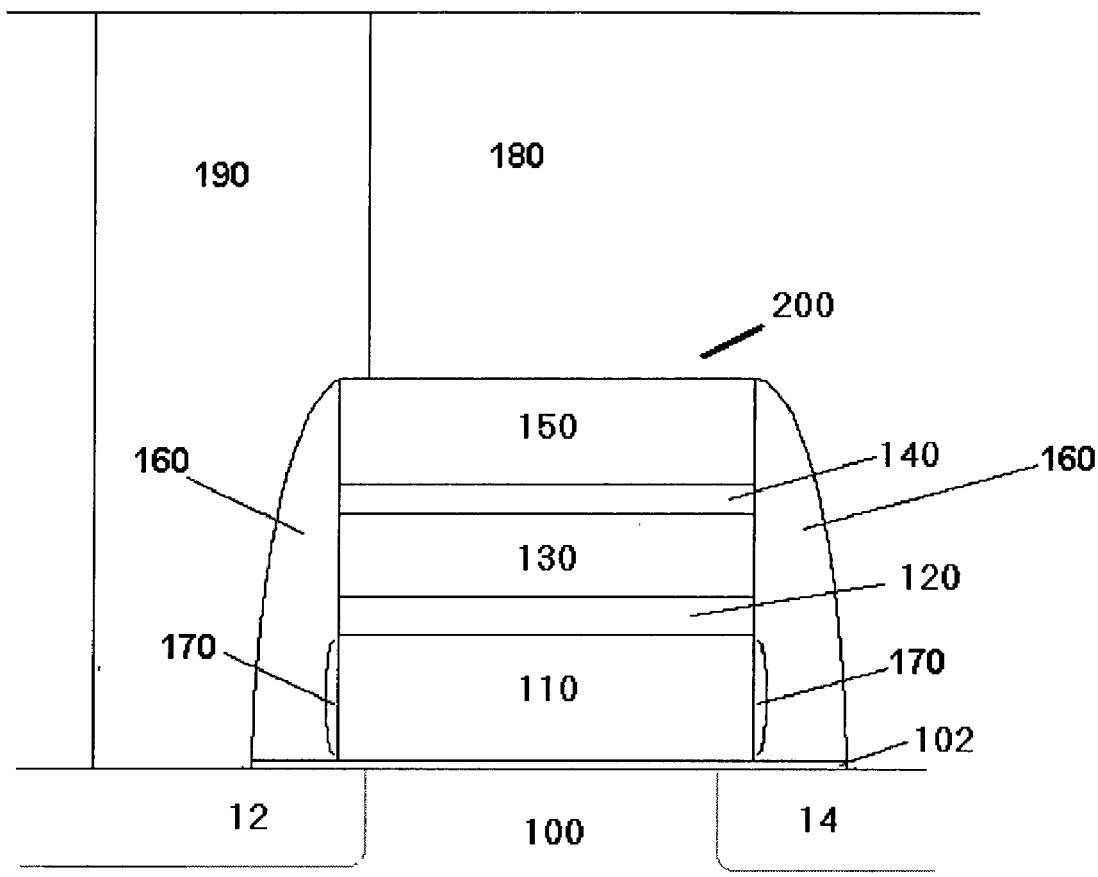
FIG. 9 show the gate stack of FIG. 9 after further processing.

As shown in FIG. 9, further processing of the gate structure may include forming sidewall oxide regions 170 on gate layer 110 and forming spacers 160 (preferably containing nitride) on the sides of the stack. Furthermore, a dielectric layer 180 maybe formed on the etch-stop layer. The dielectric layer may be formed of phosphosilicate glass (PSG), using high density plasma chemical vapor deposition (HDPCVD). This technique has been used in the past as a gap filling process because of its simultaneous depositing and sputtering. Advantageously, this allows for the formation of the interlayer dielectric layer at a temperature which is lower than past techniques (less than 750° C.), helping prevent loss of deuterium incorporated into the substrate. The temperature is less than 750° C., preferably at most 700° C., more preferably at most 600° C., most preferably at most 550° C.

Contacts or vias 190 formed may be formed through the dielectric to the substrate, as illustrated in FIG. 9. This via may be lined and filled to form a via-contact, for example with TiN and tungsten, respectively. Other processing may include forming contacts to the gate itself. After dielectric layer is formed, the etch-stop layer has a thickness of at least 800 angstroms, preferably at least 1100 angstroms, so that it may be used to allow formation of self-aligned contacts (SAC).

Self-aligned contacts (SAC) allow the design of a semiconductor device to have a distance between the gate and the via contact to the substrate, to be at most one-half the minimum gate width; the contact may even be designed to overlay the gate. SAC includes an etch-stop layer on the gate stack, together with spacers that include the etch-stop material, to prevent a misaligned contact from electrically contacting the gate itself. When present, the etch-stop layer and spacers act to prevent misalignment from forming a hole all the way to the gate, and therefore allow design of the device to have a much smaller average distance between the contact and the gate.

Other processing may be used to complete formation of semiconductor devices from the semiconductor structure. For example, source/drain regions 12,14 may be formed in the substrate, additional dielectric layers may be formed on the substrate, and contacts and metallization layers may be formed on these structures. These additional elements may be formed before, during, or after formation of the gate stack.

The related processing steps, including the etching of the gate stack layers and other steps such as polishing, cleaning, and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

EXAMPLE

Example 1

Formation of a Gate Structure

The following detailed steps would be used to form the gate stack having a split gate:

Nitrogen-containing gate oxide formation
Poly deposition - single amorphous gate deposit
Mask for P-doping
$P^+$ poly implantation
N-well implantation
P-channel implantation
$P^+$ poly implantation strip resist
Mask for N-doping
P-well implantation
$N^+$ poly implantation -continued N-channel implantation
N+ poly implantation strip resist
Tungsten gate pre-clean
Tungsten PVD, sputtering (nitrogen + argon, then argon only)
Nitride - ND$_3$ and BTBAS
Deposit ARC and Resist
Etch mask for nitride
Nitride etch - ARC, silicon nitride, and partial tungsten etch
Remove resist
Tungsten and Poly etch
Post-poly etch clean
Selective oxidation
N+ source/drain extension implant
Stripping & cleaning
P+ source/drain extension implant
Stripping & cleaning
Nitride spacer deposition (BTBAS chemistry)
Spacer etch
Post-spacer etch clean
N+ source/drain implant
Stripping & cleaning
P+ source/drain implant
Stripping & cleaning
Nitride-poly cut mask etch and clean
Dielectric deposition/planarization/mask for contacts: PSG formed by HDPCVD
self-aligned contact (SAC) etch
SAC etch clean Bottom anti-reflective coating (BARC) may be etched under the following conditions: $CF_4$ flow rate of 100 sccm, Ar flow rate of 100 sccm, power of 600 W, bias of 75 W, a pressure of 16 mTorr, and a temperature of 60° C. Temperature may be controlled, for example, by He backside cooling during the BARC etch, as well as in subsequent steps.

The resist may be trimmed under the following conditions: HBr flow rate of 160 sccm, $O_2$ flow rate of 28 sccm, power of 400 W, a pressure of 8 mTorr, a temperature of 60° C., and for a time of 10 seconds. Alternatively, the resist may be trimmed under the following conditions: HBr flow rate of 169 sccm, $O_2$ flow rate of 19 sccm, power of 400 W, a pressure of 8 mTorr, a temperature of 60° C., and for a time of 5 seconds.

BTBAS may be used to form a nitride layer (as the etch-stop layer) under the following conditions: BTBAS flow rate of 50 sccm, $ND_3$ flow rate of 100 sccm, a pressure of 150 mTorr, and a temperature of 550° C.

Etching of the nitride may be carried out with a plasma at a pressure of 30 mTorr, at a power of 500 W, a bias of 100 W, and at a temperature of 60–65° C. The gas composition may be $CHF_3$ at 275 sccm and $CF_4$ at 300 sccm. An overetch of 20% may be used.

The tungsten may be partially etched under the following conditions: $NF_3$ flow rate of 10 sccm, $Cl_2$ flow rate of 25 sccm, $O_2$ flow rate of 5 sccm, Ar flow rate of 50 sccm, $N_2$ flow rate of 30 sccm, He flow rate of 150 sccm, power of 800 W, bias of 60 W, a pressure of 4 mTorr, a temperature of 60° C., and for a time of 10 seconds.

Resist material may be removed by ashing (for example at 80° C. with a mixture of $CF_4$ and $O_2$), and the stack may be cleaned by treating the wafer with EKC265™ (EKC, Hayward, Calif.; a mixture of 2-(2 aminoethoxy) ethanol, hydroxylamine and catechol) by spinning with spraying (using a spray tool) at 65 or 70° C. for 10 minutes, then 2 minutes at 20° C., followed by rinsing with deionized water, to prevent undesirable oxidation of the tungsten. This clean may be used for any stripping and cleaning step where tungsten or tungsten nitride is exposed to prevent undesirable oxidation. Also, the clean may be carried out with downstream plasma ashing under the following conditions, followed by washing with water: step 1: $CF_4$ flow rate of 50 sccm, $H_2O$ flow rate of 160 sccm, $N_2/H_2$ flow rate of 1400 sccm, power of 1050 W, bias of 100 W, a pressure of 750 mTorr, a temperature of 80° C., and for a time of 30 seconds; step 2: $NF_3$ flow rate of 40 sccm, $H_2O$ flow rate of 170 sccm, $O_2$ flow rate of 170 sccm, bias of 150 W, a pressure of 250 mTorr, a temperature of 80° C., and for a time of 120 seconds.

The tungsten may be then etched under the following conditions: $NF_3$ flow rate of 15 sccm, $Cl_2$ flow rate of 25 sccm, $O_2$ flow rate of 5 sccm, Ar flow rate of 50 sccm, $N_2$ flow rate of 30 sccm, He flow rate of 150 sccm, power of 800 W, bias of 35 W, a pressure of 4 mTorr, and a temperature of 60° C. An overetch of the tungsten may be carried out for 5 seconds. The system may be then pumped down for 20 seconds.

The poly may be etched under the following conditions: HBr flow rate of 250 sccm, He(80%)/$O_2$(20%) flow rate of 12 sccm, power of 450 W, a bias of 40 W, a pressure of 25 mTorr, and a temperature of 60° C. A poly overetch may be carried out under the following conditions: HBr flow rate of 150 sccm, He(80%)/$O_2$(20%) flow rate of 8 sccm, He flow rate of 100 sccm, power of 200 W, a bias of 70 W, a pressure of 70 mTorr, a temperature of 60° C., and for a time of 63 seconds. Alternatively, the poly overetch may be carried out under the following conditions: HBr flow rate of 150 sccm, He(80%)/$O_2$(20%) flow rate of 13 sccm, He flow rate of 200 sccm, power of 250 W, a bias of 60 W, a pressure of 80 mTorr, a temperature of 60° C., and for a time of 53 seconds. Cleaning may be carried out as described above, or for example, by downstream, followed by rinsing with water (for example with deionized water for 7 cycles), under the following conditions: $CF_4$ flow rate of 40 sccm, $O_2$ flow rate of 1000 sccm, $H_2O$ flow rate of 200 sccm, $N_2$ flow rate of 150 sccm, power of 1700 W, a pressure of 700 mTorr, a temperature of 70° C., and for a time of 80 seconds.

The exposed sides of the poly may be covered with a layer of oxide about 50–70 angstroms thick by the selective oxidation. This may be carried out by exposing the stack to a mixture of hydrogen and oxygen (10% steam) at a temperature of 750° C. to selectively oxidize the poly relative to the tungsten and tungsten nitride.

BTBAS may be used to form a nitride layer for spacer formation under the following conditions: BTBAS flow rate of 50 sccm, $NH_3$ flow rate of 100 sccm, a pressure of 150 mTorr, and a temperature of 550° C.

Etching of the nitride (nitride-poly cut mask etch and clean) may be carried out with a plasma at a pressure of 35 mT, at a power of 280 W, and a temperature of 15° C. The gas composition for the main etch may be $CHF_3$ at 30 sccm, Ar at 60 sccm, and $O_2$ at 10 sccm. The clean may be carried out with plasma ashing in two steps, followed by a solvent clean:
  Step 1:
    pressure of 2 mTorr, temperature of 185° C., microwave power of 800 W, gas: $O_2$ at 3750 sccm, $N_2$ at 375 sccm;
  Step 2:
    same values, except a temperature of 200° C. and microwave power of 1400 W.

A dielectric layer may be formed of phosphosilicate glass (PSG) having a phosphorus content of 9%, using high density plasma chemical vapor deposition (HDPCVD). This technique has been used in the past as a gap filling process because of its simultaneous depositing and sputtering. The thickness would be 10,000 angstroms.

Etching to form contacts (SAC etch) may be carried out with a plasma at a pressure of 55 mTorr, a power of 500 W, a temperature of 35° C., with the magnet at 20 Gauss, a gas of $CF_4$ at 5 sccm, $CHF_3$ at 10 sccm, $C_2H_2F_4$ at 10 sccm, and Ar at 90 sccm, as the ARC etch; and as the main etch a pressure of 55 mTorr, a power of 500 W, a tempature of 35° C., with the magnet at 25 Gauss, a gas of $CHF_3$ at 80 sccm, $C_2H_2F_4$ at 8 sccm, and Ar at 90 sccm. The clean may be carried out with plasma ashing in two steps, followed by a solvent clean:

Step 1:
pressure of 400 mTorr, temperature of 20+/−5° C., RF power of 420 W, gas: $O_2$ at 400 sccm.

Step 2:
pressure of 750 mTorr, temperature of 20+/−5° C., RF power of 420 W, gas: $N_2$ at 400 sccm, $H_2$ at 400 sccm, and $NF_3$ at 5 sccm; or alternatively:
pressure of 750 mTorr, temperature of 40+/−5° C., RF power of 350 W, gas: $CF_4$ at 20 sccm, $N_2$/5% $H_2$ at 200 sccm, and $O_2$ at 500 sccm.

SAC etch clean may be carried out using EKC265™, with a spray tool: temperature of 70° C. for 10 minutes, and an extra 2 minutes at 20° C., followed by rinsing with deionized water and then spin drying in $N_2$; then washed with $H_2SO_4$ at 150° C. twice for 10 minutes each and then spin drying in $N_2$.

In the stack, the silicon nitride layer would have a thickness of 1300 angstroms (although the actual amount deposited may be greater since silicon nitride would be lost during the poly etch and during spacer etch), the tungsten layer would have a thickness of 325 angstroms, the tungsten nitride layer would have a thickness of 75 angstroms, and the poly layer would have a thickness of 735 angstroms. The contacts would have a width of 0.13 microns at the top, and a width of 0.05 microns at the bottom.

What is claimed is:

1. A method of forming a semiconductor structure, comprising:
   forming an etch-stop layer comprising nitride, on a stack;
   wherein the stack is on a semiconductor substrate,
   the stack comprises (i) a gate layer,
   the forming is by CVD with a gas comprising a first compound which is $Si_xL_{2x}$, and a second compound comprising nitrogen and deuterium,
   L is an amino group, and
   X is 1.

2. The method of claim 1, wherein the first compound is BTBAS, and the second compound is ammonia.

3. The method of claim 2, wherein the forming is at a temperature of at most 700° C.

4. The method of claim 2, wherein the forming is at a temperature of 500–650° C.

5. The method of claim 2, wherein
   the gate layer comprises a $P^+$ region and an $N^+$ region,
   the $P^+$ and $N^+$ regions are separated by a region which is on an isolation region of the substrate having a width of at most 0.4 microns, and
   the forming is carried out at a temperature and for a time that does not result in substantial diffusion between the $P^+$ region and the $N^+$ region.

6. The method of claim 2, wherein
   the stack further comprises (ii) a metallic layer, on the gate layer, and
   the gate layer comprises silicon.

7. The method of claim 2, further comprising forming a dielectric layer comprising phosphosilicate glass, on the etch-stop layer.

8. A method of making a semiconductor device, comprising:
   forming a semiconductor structure by the method of claim 2, and
   forming a semiconductor device from the semiconductor structure.

9. A method of making an electronic device, comprising:
   forming a semiconductor device by the method of claim 8, and
   forming an electronic device comprising the semiconductor device.

10. A method of forming a semiconductor structure, comprising:
    forming an etch-stop layer comprising nitride, on a stack at a temperature of at most 700° C.;
    simultaneously incorporating deuterium into a semiconductor substrate; and
    forming a dielectric layer at a temperature of at most 700° C., on the etch-stop layer;
    wherein the stack is on the semiconductor substrate, and the stack comprises (i) a gate layer.

11. The method of claim 10, wherein the forming is at a temperature of 500–650° C.

12. The method of claim 10, wherein
    the stack further comprises (ii) a metallic layer, on the gate layer, and
    the gate layer comprises silicon.

13. The method of claim 10, wherein
    the gate layer comprises a $P^+$ region and an $N^+$ region,
    the $P^+$ and $N^+$ regions are separated by a region which is on an isolation region of the substrate having a width of at most 0.4 microns, and
    the forming of the etch-stop layer and the forming of the dielectric layer are carried out at a temperature and for a time that does not result in substantial diffusion between the $P^+$ region and the $N^+$ region.

14. A method of making a semiconductor device, comprising:
    forming a semiconductor structure by the method of claim 10, and
    forming a semiconductor device from the semiconductor structure.

15. A method of making an electronic device, comprising:
    forming a semiconductor device by the method of claim 14, and
    forming an electronic device comprising the semiconductor device.

* * * * *